(12) United States Patent
Lee et al.

(10) Patent No.: US 8,625,661 B2
(45) Date of Patent: Jan. 7, 2014

(54) PULSE EDGE MODULATION

(75) Inventors: Edward K. F. Lee, Fullerton, CA (US); Eusebiu Matei, Valencia, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 1231 days.

(21) Appl. No.: 12/464,831

(22) Filed: May 12, 2009

(65) Prior Publication Data

US 2010/0290516 A1 Nov. 18, 2010

(51) Int. Cl.
*H03K 7/08* (2006.01)

(52) U.S. Cl.
USPC .......... 375/238; 329/313; 332/112; 370/205; 370/213; 375/239; 375/242

(58) Field of Classification Search
None
See application file for complete search history.

(56) References Cited

U.S. PATENT DOCUMENTS

| | | | |
|---|---|---|---|
| 2003/0016056 A1 | 1/2003 | Matsuzaki | |
| 2004/0172104 A1* | 9/2004 | Berg et al. | 607/60 |
| 2005/0068885 A1 | 3/2005 | Becker | |
| 2006/0093029 A1 | 5/2006 | Becker | |

FOREIGN PATENT DOCUMENTS

EP 1703627 A2 9/2006

OTHER PUBLICATIONS

Kazutaka N, El Gamal A, A CMOS 160 MB/S Phase Modulation I/O Circuit, 1994 IEEE International Solid State Circuits Conference, San Francisco, CA, pp. 108-109, Feb. 16-18, 1994.

\* cited by examiner

*Primary Examiner* — Adolf DSouza
(74) *Attorney, Agent, or Firm* — Oleh J. Zajac

(57) ABSTRACT

Systems and methods for the pulse edge modulation of digital carrier signals for communications systems. A digital carrier signal is generated and the carrier is pulse edge modulated with digital data. A pulse edge modulated signal is generated by either retarding or advancing each pulse edge of a carrier to be modulated relative to its original position in time, depending on the state of the digital bit to be modulated on that edge.

25 Claims, 16 Drawing Sheets

PULSE EDGE MODULATION

CROSS REFERENCE TO RELATED APPLICATIONS

The present application is related to U.S. patent application Ser No. 12/464,843 entitled Pulse Edge Demodulation and filed on May 12, 2009, which issued as U.S. Pat. No. 8,284,830 on Oct. 9, 2012.

FIELD OF THE INVENTION

The present invention generally relates to systems and methods for the pulse edge modulation of digital carrier signals for communications systems.

BACKGROUND

In an implantable battery powered biomedical device, the size and mass of the battery and the associated integrated circuits, as well as other passive components may not allow such a system to be directly attached to body parts, such as nerve bundles and cortices, directly. As a result, the implantable device may be separated into two units: a remote unit and a main unit. The remote unit may include microelectrode arrays with lighter mass and smaller size and may attach to the body parts where sensing of biosignals or stimulation of the nerves are actually applied. The main unit may have a greater mass and larger size and may be placed at a location inside the body suitable for mounting the larger unit. When an implantable device is separated into a remote and main unit, problems can arise in transmitting power and data between the remote unit and the main unit.

SUMMARY OF THE INVENTION

Systems and method for pulse edge modulation of digital carrier signals for communications systems are described which are useful in body implanted electronics. A digital carrier signal is generated by a main system. The carrier is pulse edge modulated with digital data. The modulated signal is sent from a main system to a remote system over a first set of transmission lines (downlink). The modulated signal can be a multiphase signal used to transmit power and data to the remote unit from the main unit. The modulated signal is demodulated by the remote system to obtain the transmitted digital data. The remote system sends data to the main system over a second set of transmission lines (uplink), during time periods when the modulated signal sent by the main system to the remote system is in a steady state, thus minimizing interference between the downlink and uplink transmissions.

DETAILED DESCRIPTION OF EMBODIMENTS

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" can include reference to both the singular and the plural. The meaning of "in" can include "in" and "on." The term "connected" means a direct electrical, electro-magnetic, mechanical, logical, or other connection between the items connected, without any electrical, mechanical, logical or other intermediary there between. The term "coupled" means a direct connection between items, an indirect connection through one or more intermediaries, or communication between items in a manner that may not constitute a physical connection. The term "circuit" can mean a single component or a plurality of components, active and/or passive, discrete or integrated, that are coupled together to provide a desired function. The term "signal" means at least one current, voltage, charge, data, or other such identifiable quantity.

A multiphase signal is defined as a set of digital signals with the individual signal components having spaced phase differences and a monotonic increase of phase when going from one signal to the next one.

Figure 1:
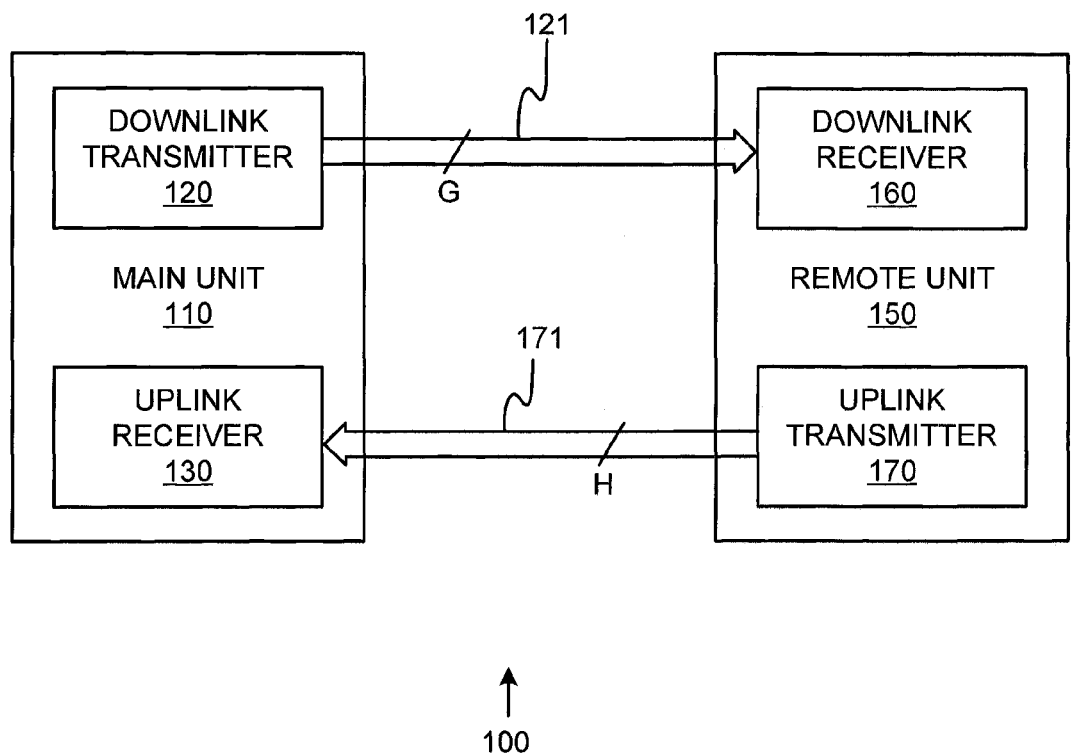
FIG. 1 is a block diagram illustrating an exemplary communications system including a main unit and a remote unit.

FIG. 1 is a block diagram illustrating an exemplary communications system 100 according to one embodiment of the present invention. The system 100 includes a main unit 110 and a remote unit 150 that are coupled together by a first set of transmission lines 121 and a second set transmission lines 171. The first set of transmission lines 121 has G conductors, where G is an integer of at least 2. Transmission line 121 is used to transmit (downlink) a pulse edge modulated signal (herein: PEM) from downlink transmitter 120 in main unit 110 to the downlink receiver 160 in remote unit 150. The second set of transmission lines 171 has H conductors, where H is an integer of at least 2. Transmission line 171 is used to transmit (uplink) serial communications signals from uplink transmitter 170 in remote unit 150 to uplink receiver 130 in main unit 110. In other embodiments, such as the those shown in FIGS. 6 and 7, the first set 121 of transmission lines can be used to transmit a multiphase signal including DC power using three conductors from main unit 110 to remote unit 150.

In an implanted biomedical system, transmission or signal lines 121 and 171 between the main and remote units can be formed into a wire bundle that is connected between main unit 110 and remote unit 150. The number of wires between main 110 and remote 150 systems should be minimized to reduce the size and weight of the wire bundle. The wire bundle of system 100 has at least 4 conductors. System 100 can include a reduced number of wires that transmit power and data signals safely using AC coupled signals. For example, the wire bundle in the embodiment of the system illustrated in FIGS. 6 and 7 includes five wires.

For safety reasons, the wires that carry data and power signals between implanted biomedical systems, such as, units 110 and 150 should not carry DC power, but should carry AC coupled signals to prevent any damage to adjacent tissue, which could occur if there were any leakage of DC current into the surrounding tissue. Commonly assigned U.S. Pat. No. 7,439,821 discloses a system for transmitting DC power from a main to a remote system using a multiphase signal. U.S. Pat. No. 7,439,821 is incorporated by reference herein.

The discussion below of the various timing, block and process diagrams refer to various examples and embodiments of the present invention.

Figure 2A:
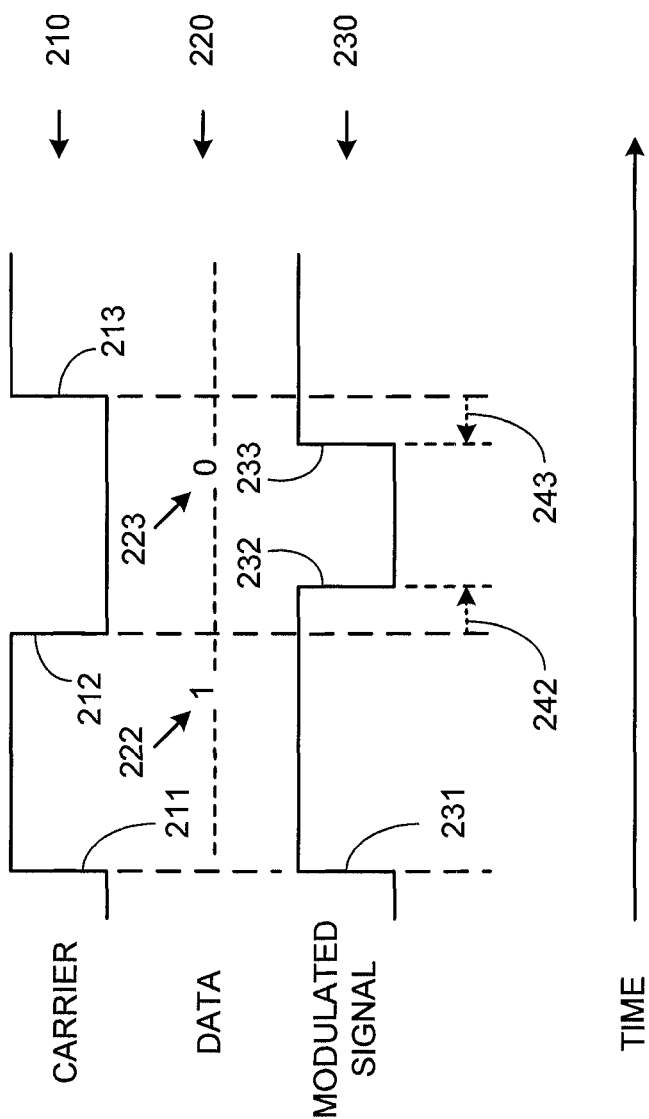
FIG. 2A is a timing diagram illustrating a digital carrier signal, digital data input and a pulse edge modulated signal, in a system or process for modulation, according to an embodiment of the present invention.

FIG. 2A is a timing diagram illustrating digital carrier signal 210, digital data input 220 and pulse edge modulated signal 230, in a system or process for modulation according to an embodiment of the present invention. Digital data 220 is an input to a PEM modulator. Modulated signal 230 is the output of a PEM modulator. Modulated signal 230 is generated by the pulse edge modulation of carrier 210 with digital data bits 222 and 223. Digital carrier signal (herein: carrier) 210 is either generated within a PEM modulator or is provided by another source in a transmitter. Carrier 210 is a pulse stream with a predetermined pattern, a square wave, such as a clock, where the time interval between successive transition edges is a fixed constant time interval. Pulse edge modulation (PEM) of carrier 210 uses data 220 to generate modulated signal 230 by moving each edge of carrier 210 relative to its original position in time, depending on the value of the digital bit to be modulated on that edge. In the PEM system shown in FIG. 2A, a digital bit state of "0" results in delaying an edge by a first amount of time, e.g., a fixed time interval. A digital bit state of "1" results in advancing an edge by a second amount of time, e.g., a fixed time interval.

In other embodiments, a PEM system can also modulate in the reverse of the above, by delaying an edge by a fixed time interval in response to a digital bit state of "1" and by advancing an edge by a fixed time interval in response to a digital bit state of "0". In FIG. 2A, the first and second amounts of time are equal. In other embodiments, the first and second amounts of time can be unequal. In some embodiments, the first and second amounts of time can both delay edges, but by different amounts of time. In other embodiments, the first and second amounts of time can both advance edges, but by different amounts of time.

It should also be noted that pulse edge modulation as shown in this and subsequent figures applies to both rising and falling edges of a carrier. In other embodiments, pulse edge modulation can be implemented to modulate only the rising edges or only the falling edges of a carrier.

As shown in FIG. 2A, digital data bit 222="1" modulates edge 212, which results in edge 212 being advanced by a fixed time interval 242 to position 232. For digital data bit 223="0", edge 213 is delayed by a fixed time interval 243 to position 233. Edge 211 of carrier 210 is not modulated by data and the position of corresponding edge 231 in modulated signal 230 is not changed. Edge 231 can be used as a timing reference point, or as a synchronizing pulse edge. Edge 231 can be used as a timing reference to synchronize transmitter 120 in main unit 110 with receiver 160 in remote unit 150 to demodulate the received modulated signal 230. Timing reference edge 231 can also be used by remote unit 150 to generate a local clock or to synchronize a local clock with the modulated signal.

In the embodiment presented in FIG. 2A, time intervals 242 and 243 are equal in time interval. In other embodiments, time intervals 242 and 243 can be dissimilar.

Figure 2B:
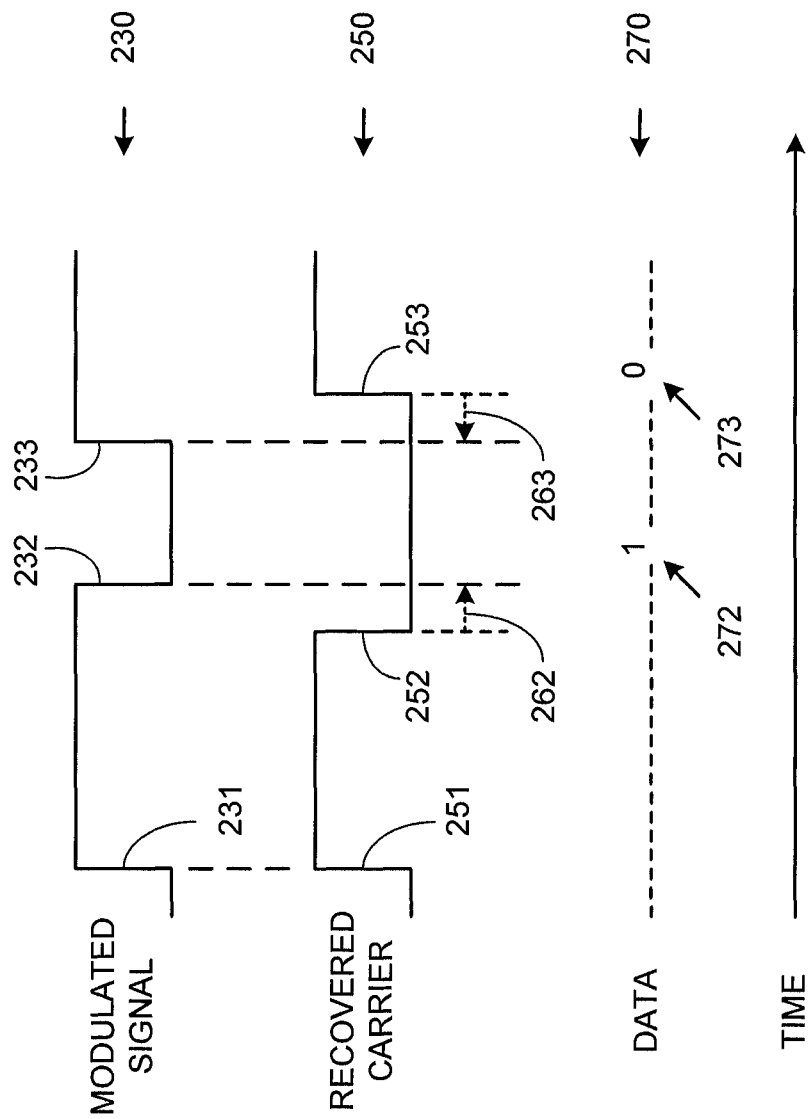
FIG. 2B is a timing diagram illustrating a modulated signal, a recovered digital clock signal and digital data output, in a system or process for demodulation, according to an embodiment of the present invention.

FIG. 2B is an exemplary timing diagram illustrating modulated signal 230, recovered carrier 250 and data output 270 in a demodulator or process for demodulation according to an embodiment of the present invention. Modulated signal 230 is demodulated by comparing the relative timing of the edges of signal 230 with the respective edges of recovered carrier 250. Recovered carrier 250 can be generated by a variety of systems or methods, such as for example, recovering a clock signal from modulated signal 230 or retrieving from a memory system in remote unit 150 timing data sufficient to generate a timing reference signal equivalent to recovered carrier 250. Edge 251 of recovered carrier 250 is synchronized with unmodulated edge 231 of modulated signal 230. Such synchronization or alignment in time of the respective unmodulated edges of signals 230 and 250 facilitates the demodulation of subsequent modulated edges of signal 230.

Modulated edge 232 of signal 230 is compared with recovered carrier edge 252 and since edge 232 is advanced in time with respect to edge 252 by time interval 262, then edge 232 represents a digital bit="1", thus generating a digital data output bit 272 of "1". Modulated edge 233 of signal 230 is compared with recovered carrier edge 253 and since edge 233 is retarded in time with respect to edge 253 by time interval 263, then edge 233 represents a digital bit="0", thus generating a digital data output bit 272 of "0".

Figure 3A:
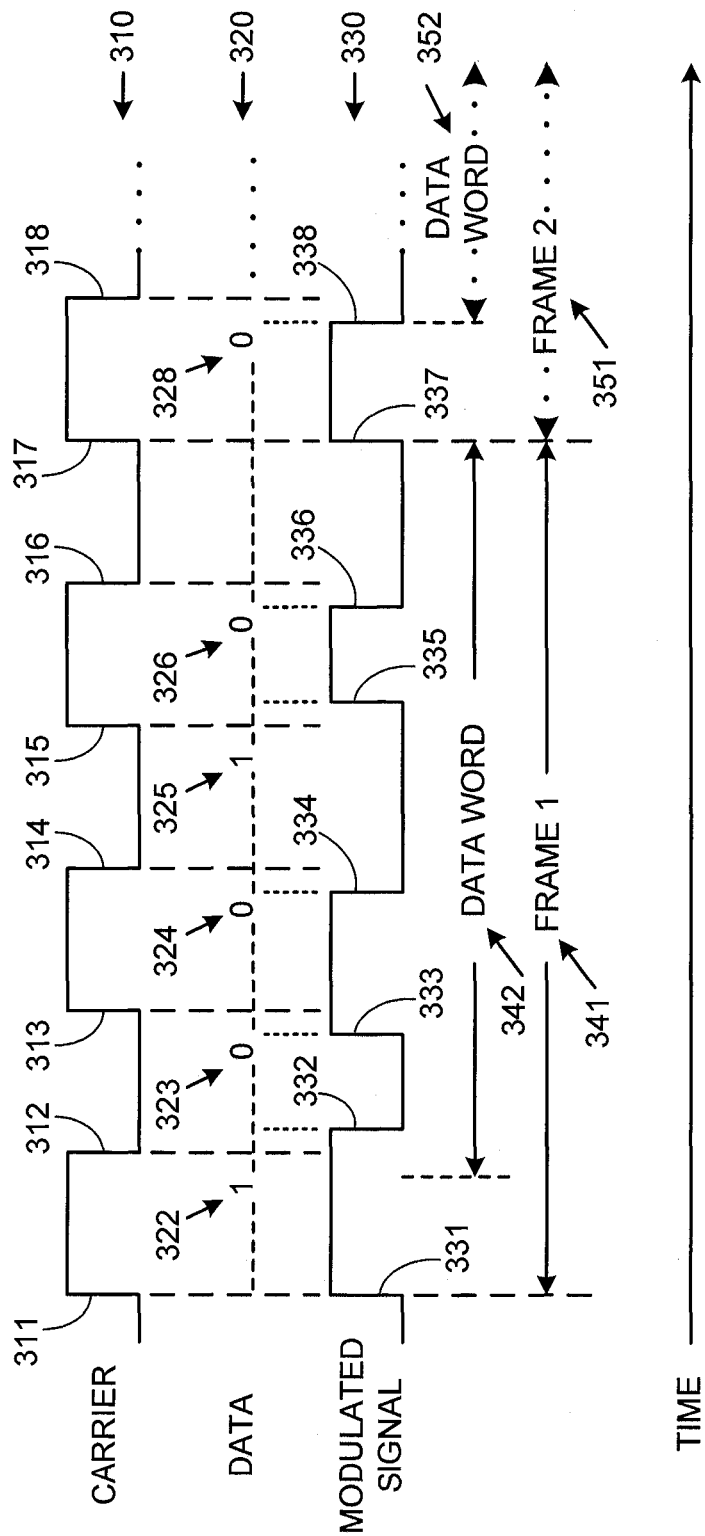
FIG. 3A is a timing diagram illustrating a digital carrier signal, a data word input and a frame of a pulse edge modulated signal, in a system or process for modulation, according to one embodiment of the present invention.

FIG. 3A is a timing diagram illustrating digital carrier signal 310, data word 342 and frame 341 of a pulse edge modulated signal 330, in a system or process for modulation, according to one embodiment of the present invention. Carrier 310 is a pulse stream. Edge 331 of modulated signal 330 is used as a timing reference to mark the start of frame 341. Edge 331 can also be understood as a frame synchronizing edge, since it marks the start of frame 341. Frame 341 of modulated signal 330 includes start of frame reference edge 331 and modulated edges 332-336 corresponding to data word 342 made of five data bits 322-326. Modulated signal 330 is generated by the pulse edge modulation of carrier 310 with digital data bits, such as 322-326, 328, etc. Each edge 312-316 of carrier 310 is modulated by each respective value of digital bits 322-326 to produce modulated edges 332-336 of modulated signal 330. After frame 341 is transmitted to the remote unit 150, then the next frame 351 is transmitted.

Frame 351 (partially shown) starts with frame synchronizing edge 337 and the rest of frame 351 consists of data word 352 (partially shown). Each frame synchronizing edge, such as 331, can be used by remote unit 150 as a timing reference to generate a local clock. Unmodulated edge 331 can also be used as a timing reference edge to synchronize modulated signal 330 with a timing reference signal or a recovered carrier in a PEM demodulator to facilitate demodulation of modulated signal 330.

Frame 341 with a data word 342 of 5 bits is an example. A data word in a frame can be any length of N bits as determined by the design of the system, so that the modulator in downlink transmitter 120 assembles a frame 341 of a given length to contain a frame synchronizing edge and a data word of N bits. After transmission of the modulated signal 330 to the remote unit 150, the start of frame edge 331 is detected and the modulated signal 330 is demodulated. In other embodiments, the frame synchronizing edge can mark the end of a frame of modulated data.

Figure 3B:
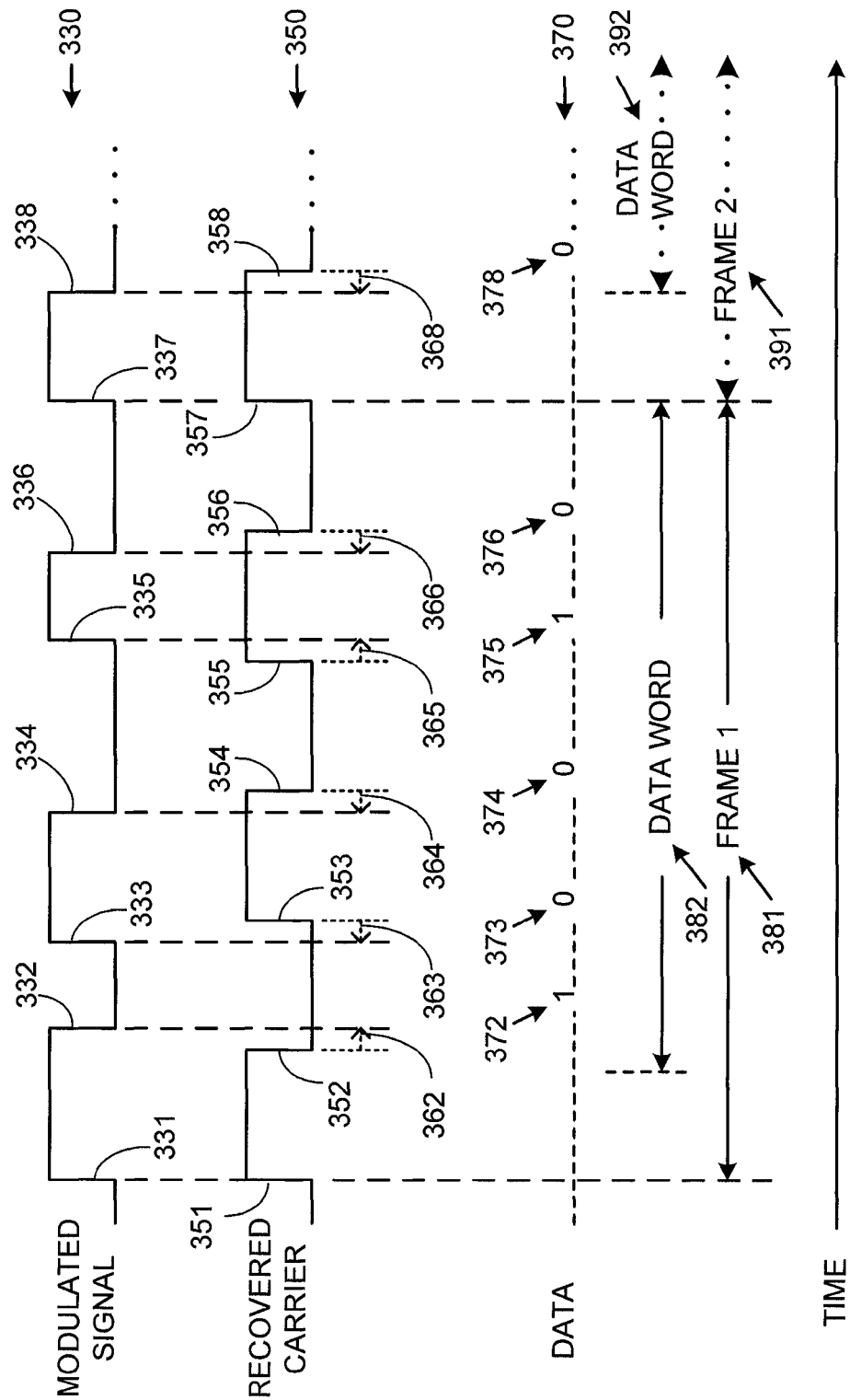
FIG. 3B is a timing diagram illustrating a frame of a pulse edge modulated signal, a recovered digital carrier signal and output data, in a system or process for demodulation, according to one embodiment of the present invention.

FIG. 3B is an exemplary timing diagram illustrating frame 381 of pulse edge modulated signal 330, recovered carrier 350 and output data 370 according to one embodiment of the present invention. Modulated signal 330 includes unmodulated edge 331 and modulated edges 332-336. Recovered carrier 350 is generated within downlink receiver 160 by any of a variety of systems and processes. A timing reference signal equivalent to a recovered carrier can be generated by, for example, recovering a clock signal from the modulated signal 330.

Regardless of how recovered clock 350 is generated, edges 352-356 of recovered carrier 350 correspond to the respective positions of modulated edges 332-336, prior to modulation. The demodulator in downlink receiver 160 can demodulate modulated signal 330 by comparing the position of each modulated edge 332-336 with the respective edges 352-356 of recovered carrier 350. If a modulated edge, such as 333, is retarded in time with respect to its respective unmodulated position 353, then a digital output bit 373 with a value of "0" is generated. If a modulated edge, such as 332, is advanced in time with respect to its respective unmodulated position 352, then a digital output bit 372 with a value of "1" is generated. Similarly, all the modulated edges of 330 are demodulated and digital data 370 is outputted.

FIG. 3B shows a data word of 5 bits as an example. In a more general case, every N+1 edges of modulated signal 330 contains a frame synchronizing edge, such as edge 331 and N modulated edges, which when demodulated generate N digital data bits.

Figure 4:
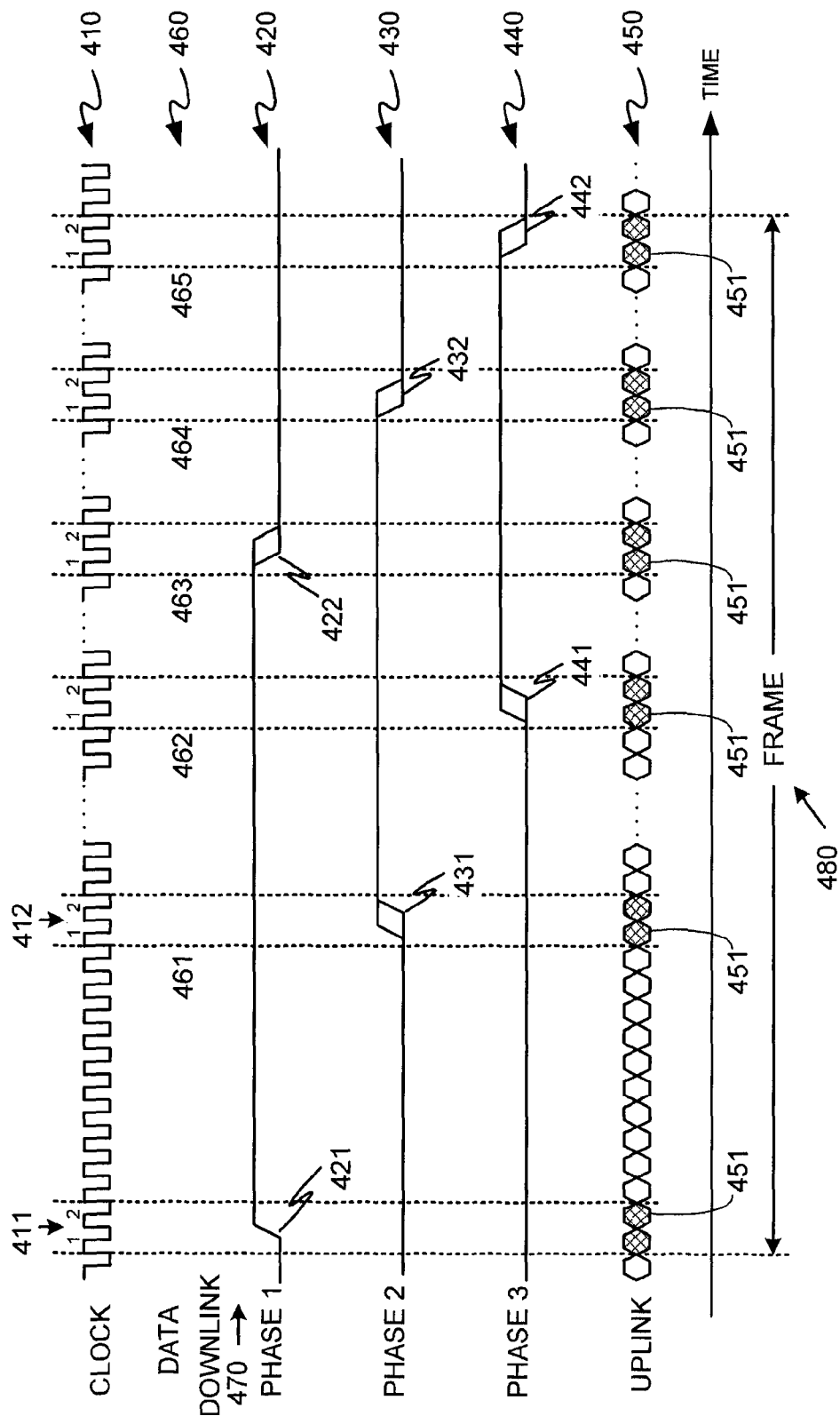
FIG. 4 is a timing diagram including signals transmitted between a main unit and a remote unit of an alternate embodiment of the present invention.

FIG. 4 is an exemplary timing diagram including signals transmitted between a main unit 110 and a remote unit 150, according to an alternate embodiment of the present invention. The timing diagram illustrates clock 410, downlink multiphase signal 470 made of three phases: first phase 420, second phase 430 and a third phase 440, digital data bits 461-465 and uplink signal 450. Frame 480 of the transmitted signal 470 includes unmodulated edge 421 and modulated edges 431, 441, 422, 432 and 442. Signal 470 is transmitted from main unit 110 to remote unit 150 over a transmission line, such as 121 in FIG. 1, but with three conductors. Frame synchronization edge 421 is a start of frame edge for frame 480.

Clock 410 is generated in main unit 110, and is not transmitted to remote unit 150. A similar clock signal can be recovered from the multiphase signal 470 received by remote unit 150. In the main unit 110, an unmodulated multiphase signal (not shown in FIG. 4) is generated and is pulse edge modulated by data 415 consisting of digital data bits 461-465 and results in modulated signal 470. Signal 470 includes signals 420, 430 and 440. The unmodulated multiphase signal is a set of square wave carriers and can be generated from clock 410, so that each edge of the unmodulated multiphase signal is coincident with a respective edge of the clock in main unit 110.

Each phase of the unmodulated multiphase signal is equally spaced and separated by a 120 degree phase difference. As discussed previously and disclosed in U.S. Pat. No. 7,439,821, a multiphase signal can be used to transmit DC power from the main unit 110 to the remote unit 150, without risking possible damage to surrounding tissue, which could occur, if DC power were sent over a set of transmission lines and some leakage of the DC power to surrounding tissue took place. Although illustrated as three phases, any other number of phases may also be employed (e.g., 2 phases, 4 phases, 5 phases, etc.) without departing from the present invention. The number of lines in transmission line 121 used to transmit the downlink signal from main unit 110 to remote unit 150 is equal to the number of phases of the modulated signal.

The first edge 421 of the first phase 420 is unmodulated and used as a timing reference edge or a start of frame edge. In FIG. 4, start of frame edge 421 is aligned with the rising edge of clock pulse 2 in time interval 411. The original, unmodulated position of edge 431 is aligned with the rising edge of pulse 2 in time interval 412. If the value of digital data bit 461="0", then edge 431 is modulated by retarding edge 431 by a fixed amount of time, e.g., half a clock cycle, and is aligned with the falling edge of clock pulse 1 in time interval 412. If the value of digital data bit 461="1", then edge 431 is modulated by advancing edge 431 by a fixed amount of time, e.g., half a clock cycle, and is aligned with the falling edge of clock pulse 2 in time interval 412. Thus, modulated edge 431 is aligned with either the falling edge of clock pulse 1 or the falling edge of clock pulse 2 in time interval 412, depending on the value of digital bit 461. Similarly, each of edges 441, 422, 432 and 442 are either retarded or advanced relative to their original timing, depending on the value of data bits 462, 463, 464 and 465. Five bits of data can be transmitted per cycle of the downlink signal 470 in the example shown in FIG. 4.

In a general case, 470 can be modulated by N digital data bits, where N is an integer greater than one and in the example in FIG. 4, N=5. After the next unmodulated timing reference edge or frame synchronization edge is transmitted, another N modulated edges are transmitted and so on.

The remote 150 transmits uplink signal 450 from the remote 150 to the main unit 110 over a second set of transmission lines, such as 171. Transmission lines 121 and 171 between the main unit 110 and the remote 150 are in the same wire bundle. The uplink signal 450 is a serial link transmission, of which there are many suitable types, such as a LVDS (low voltage differential signaling) signal. If 470 is used to transmit power and data to remote unit 150, then uplink signal 450 can be much smaller in amplitude than multiphase signal 470, since 450 is used only to transmit data. In order to avoid interference caused by transitions of multiphase downlink signal 470, the uplink signal 450 is not sent during periods 451 when any phase of the multiphase signal 470 is in transition. If uplink signal 450 is sent on 171 during time periods 451, the uplink signal 450 can be subject to signal interference, crosstalk, ground bounce, or other adverse transient effects due to the proximity of transmission line 121 to transmission line 171, which could result in invalid data. By not transmitting data during periods 451, reception errors due to interference from the 470 signals on transmission line 121 are minimized. In the example shown in FIG. 4, time periods 451 are each two clock cycles in length because the downlink signal can transition during either the first or second clock cycle depending on the state of each digital data bit 461-465 (logic 0 or logic 1).

FIG. 4 shows a three-phase signal that is modulated by a single bit of data in a window of two clock cycles at each transition of the downlink signal 470, except for the unmodulated edge 421. Alternative embodiments can utilize another arbitrary number of phases (two or more) with a different number of signal lines. For example in a four-phase system, four signal lines are utilized where the transmitted multiphase signals are arranged ninety degrees (90°) apart, with seven (7) bits of data encoded in the edge transitions of one frame. Similarly, a five-phase system can utilize five signal lines with transmitted multiphase signals arranged seventy-two (72°) degrees apart and nine (9) bits of data encoded in the edge transitions of one frame. Other embodiments can utilize any number of appropriate signal lines in a transmission line, and any number N of data bits per frame as may be designed for a particular system, where N is an integer greater than one.

Figure 5B:
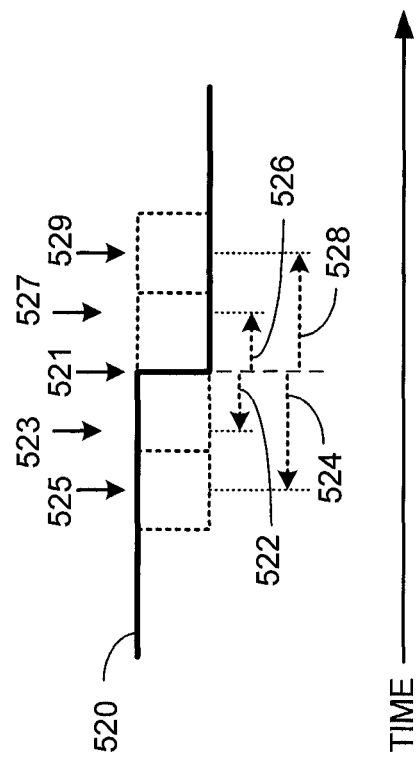
FIGS. 5A and 5B are timing diagrams illustrating further exemplary signals transmitted between a main unit and a remote unit according to another embodiment of the present invention.
Figure 5A:
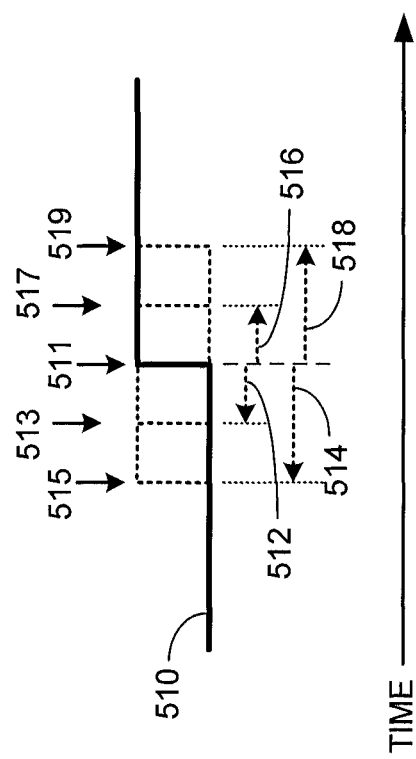

FIGS. 5A and 5B show timing diagrams illustrating further exemplary signals transmitted between main unit 110 and remote unit 150 according to other alternate embodiments of the present invention. FIG. 5A shows various methods of modulating rising edge 511 of carrier 510. Edge 511, when pulse edge modulated, is temporally displaced in time, either to retard edge 511 to position 513 or 515 or to advance edge 511 to position 517 or 519, depending on which digital binary bit state is being modulated onto edge 511. Temporal displacement time intervals 512 and 516 are equal in time interval and time intervals 514 and 518 are also equal in time interval, but in other embodiments, they can be unequal. Since modulation of edge 511 can reposition 511 to four possible time positions, then multi-bit modulation of edge 511 is facilitated. Each of the four possible locations can, for example, map to binary data states of 00, 01, 10 and 11. In a system using PEM, the more possible locations available for the modulation of an edge, the more binary states can be modulated using that edge of a carrier.

FIG. 5B shows various methods of modulating falling edge 521 of carrier 520. FIG. 5B is similar to FIG. 5A, except that FIG. 5B is for a falling edge of a carrier. Edge 521, when pulse edge modulated, is temporally displaced in time, either to retard edge 521 to position 523 or 525 or to advance edge 521 to position 527 or 529, depending on which digital binary bit state is being modulated onto edge 521. Temporal displacement time intervals 522 and 526 are equal in time interval and time intervals 524 and 528 are also equal in time interval, but in other embodiments, they can be unequal. Since modulation of edge 521 can reposition 521 to four possible time positions, then the multi-bit modulation of edge 521 is facilitated, since each of the four possible locations can map to binary data states of 00, 01, 10 and 11.

Figure 6:
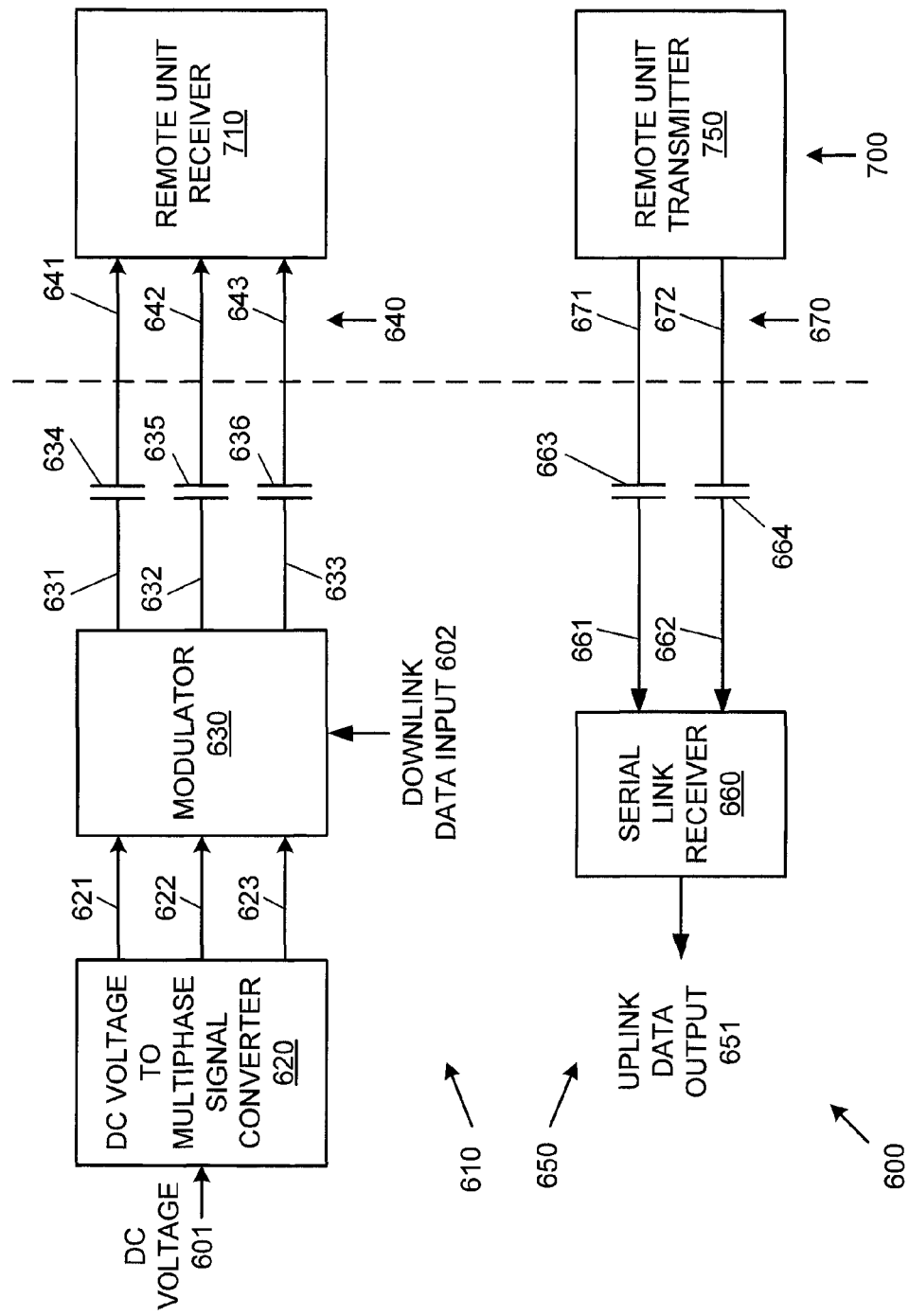
FIG. 6 is a block diagram of an exemplary main unit according to the present invention.
Figure 8:
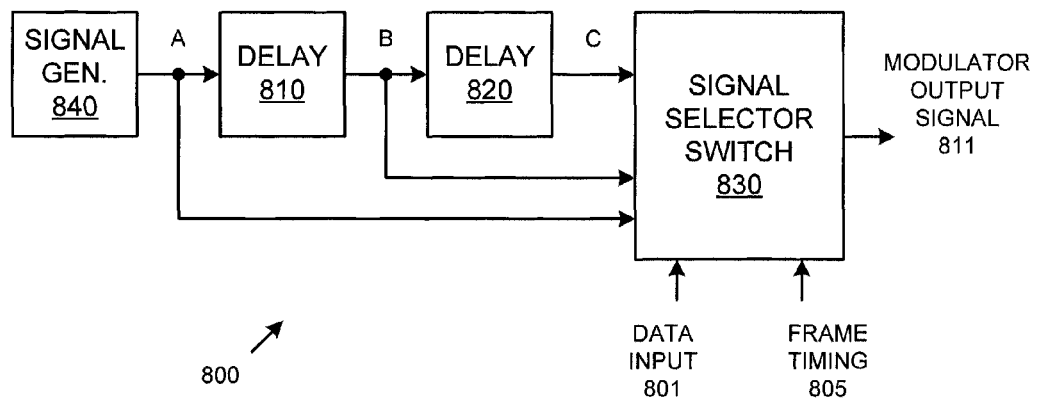
FIG. 8 is a block and timing diagram for an exemplary modulator according to one embodiment of the present invention.
Figure 8:
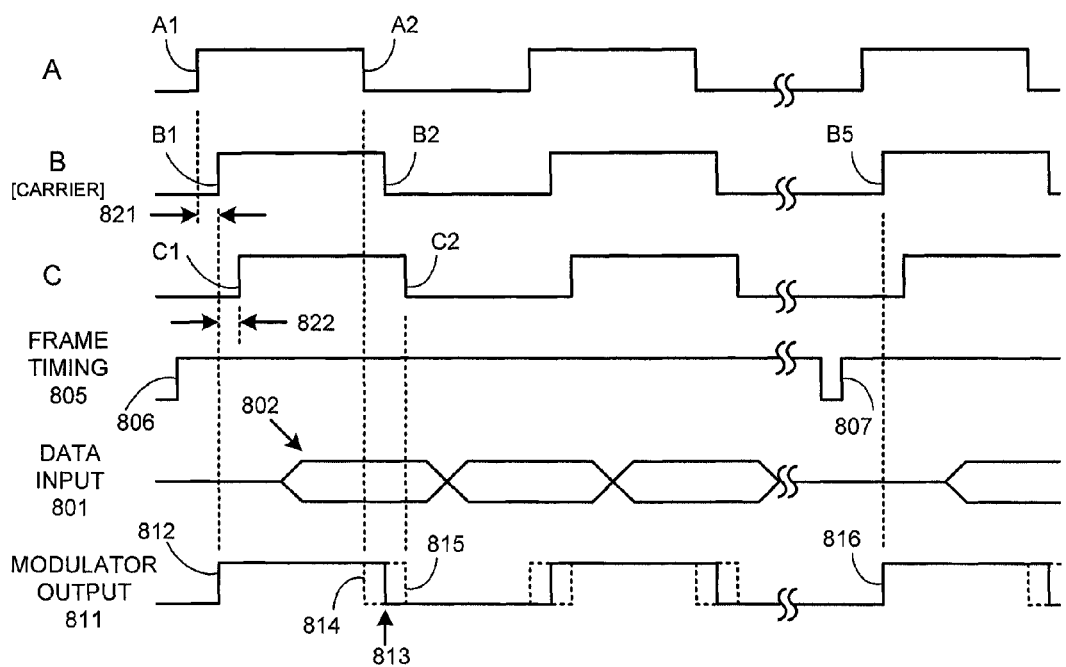

FIG. 6 is a block diagram of an exemplary main unit 600 according to an embodiment of the present invention. Main unit 600 is connected to remote unit 700 by transmission lines 640 and 670. Main unit 600 includes downlink transmitter 610 and uplink receiver 650. In downlink transmitter 610, DC voltage 601 is converted to a multiphase signal consisting of phases 621, 622 and 623 by DC to multiphase converter 620. Modulator 630 pulse edge modulates the multiphase signal output from DC to multiphase converter 620 using downlink data input 602 to generate a modulated signal 470 on output lines 641, 642 and 643. Reference is made here to FIG. 8 for an example of a pulse edge modulator. The output lines 631, 632 and 633 of modulator 630 are AC coupled to downlink transmission line 640 by respective capacitors 634, 635 and 636. Transmission line 640 consists of lines 641, 642 and 643 and is connected to remote unit receiver 710.

Uplink receiver 650 includes serial link receiver 660 connected to uplink transmission line 670 from remote unit transmitter 750 to receive uplink serial signal 450. The output lines 671 and 672 of transmission line 670 are AC coupled to input lines 661 and 662 of serial link receiver 660 by respective capacitors 663 and 664. The output 651 of serial line receiver 660 is the uplink data received from the remote unit. There are many serial communications systems and protocols, such as low voltage differential signaling (LVDS) suitable for the uplink communications link. FIG. 6 does not specifically show the use of a clock signal for main unit 600 in order to simplify the diagram, since it is well known that digital circuits typically use clock signals.

Figure 7:
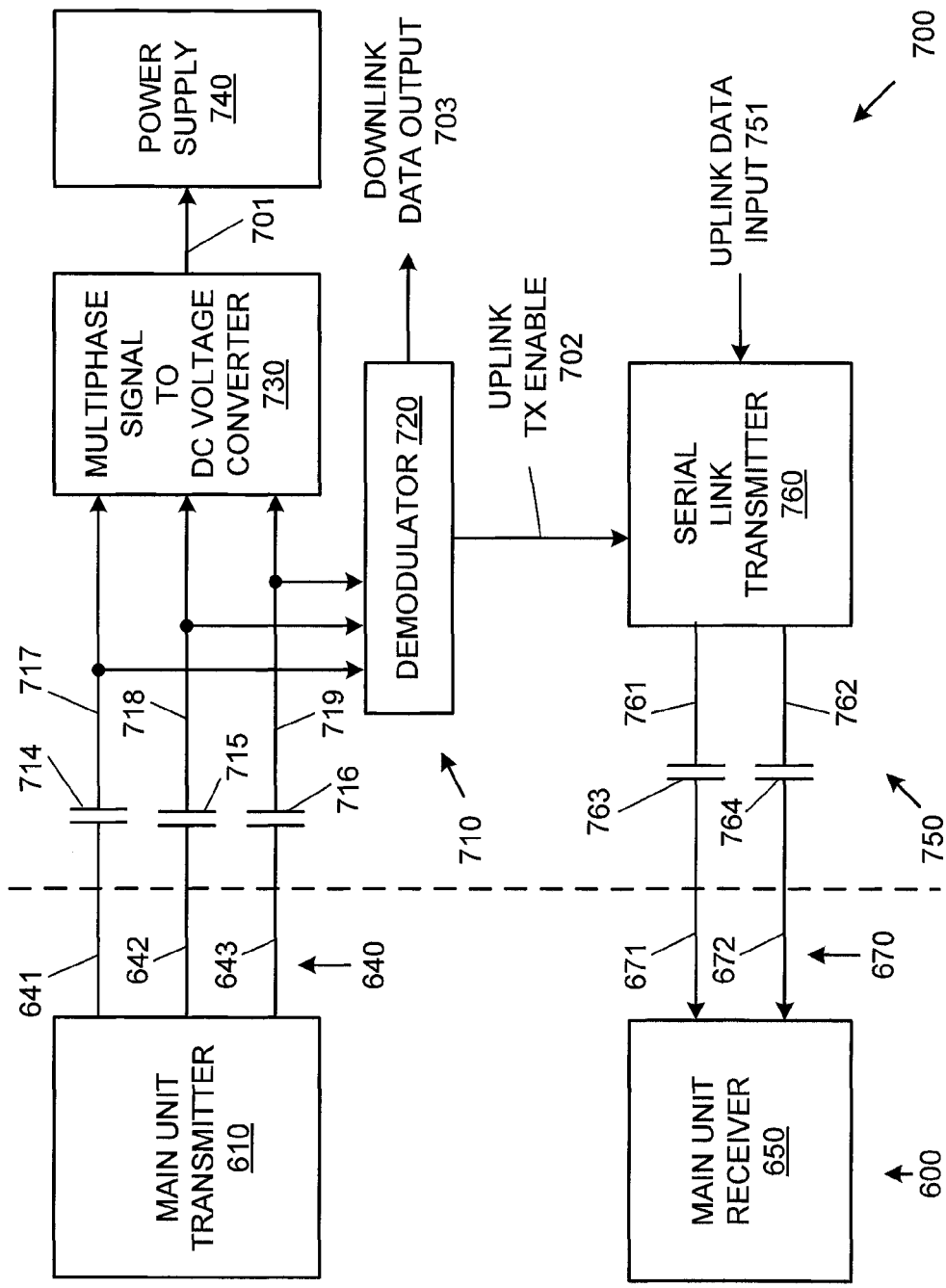
FIG. 7 is a block diagram of an exemplary remote unit according to the present invention.

FIG. 7 is a block diagram of an exemplary remote unit 700 according to an embodiment of the present invention. Remote unit 700 is connected to main unit 600 by transmissions lines 640 and 670. The downlink signal 470 from main unit transmitter 610 is transmitted over transmission line 640 and received by the remote unit receiver 710. Transmission line 640 includes lines 641, 642 and 643, which are AC coupled to the input lines 717, 718 and 719 by respective capacitors 714, 715 and 716. Lines 717, 718 and 719 connect the received modulated downlink signal 470 to the multiphase to DC converter 730 and to demodulator 720. The multiphase to DC converter 730 converts the received modulated signal to DC voltage 701, which is connected to power supply 740 and is used to power the remote unit 700.

Demodulator 720 demodulates the received modulated signal 470 and generates downlink data output on line 703. Demodulation of 470 by demodulator 720 can be accomplished using one of a variety of systems or processes, and reference is made to the exemplary demodulator discussed with regard to FIGS. 9A and 9B. For example, a demodulator 720 can be designed for a frame of a certain number of edges with one start of frame marker and N modulated edges. In other embodiments, a demodulator 720 can be designed for a frame of N modulated edges and an end of frame marker. Demodulation of the received modulated signal 470 can be performed using a recovered carrier in the remote unit. A recovered carrier will provide timing information to enable demodulator 720 to determine if a received modulated edge has been modulated before or after an unmodulated edge and thus determine if the data bit state modulated on an edge is a digital "zero" or a "one." A recovered carrier can be provided by a variety of circuits or methods, as discussed herein with regard to the exemplary demodulator shown in FIGS. 9A and 9B.

Demodulator 720 also generates uplink transmit enable signal 702 sent to the serial link transmitter 760 in the uplink transmitter 750. The uplink transmit enable signal 702 communicates to the uplink transmitter 750, the timing information needed to enable uplink transmissions during time periods when the modulated signal 470 is substantially in a steady state and not during transition periods of the downlink signal, such as time periods 451 shown in FIG. 4. The uplink transmit enable signal 703 can be generated in various ways. For example, the uplink transmit enable signal 702 can be generated based on the design parameters of a PEM system, including the frequency and number of phases of a PEM multiphase signal such as 470 in FIG. 4 and determining the size of the windows in time, when there are no transitions in the modulated signal and enabling uplink transmissions during such periods.

Uplink transmitter 750 includes serial link transmitter 760, which encodes uplink data 751 for transmission to main unit receiver 650. Serial link transmitter output lines 761 and 762 are AC coupled to transmission line 670 on lines 671 and 672 by respective capacitors 763 and 764. There are many serial communications systems and protocols suitable for the uplink communications link, such as low voltage differential signaling (LVDS).

FIG. 8 is a block and timing diagram for an exemplary modulator 800 according to one embodiment of the present invention. Modulator 800 consists of delays 810 and 820 and digital selector switch 830. The inputs to modulator 800 are digital signal A from signal generator 840, data input 801 and frame timing signal 805. The output of modulator 800 is pulse edge modulated signal 811. Modulated signal 811 is generated by the pulse edge modulation of carrier signal B with digital data 801. Digital signal A is a pulse train signal which is input to delay 810 and is delayed by a fixed time interval 821, resulting in carrier signal B. Carrier signal B is connected to the input of delay 820 and signal B is delayed by a fixed time interval 822. Time intervals 821 and 822 are equal in time duration. Signals A, B and C are timing reference signals connected to signal selector switch 830. The inputs to signal selector switch 830 include digital data 801 and frame timing 805. Carrier signal B is a pulse train waveform. Relative to the edges of carrier B, the edges of digital signal A are retarded in time by time interval 821. Relative to the edges of carrier B, the edges of digital signal C are advanced in time by time interval 822. The low to high transition of frame timing pulse 805 is used by switch 830 to switch edge B1 of signal B to the output as part of output signal 811. Edge B1 is switched to the output 811 as edge 812. Since edge 812 of output 811 is not modulated, then edge 812 is a frame start or frame synchronization edge. Alternatively, a high to low transition of frame signal 805 can be used to notify switch 830, so that the next transition of the output signal 811 should not be modulated, since it is a start of frame edge.

The next digital data bit 802 determines the operation of switch 830. If data bit 802 is a "0", then switch 830 selects the next edge A2 of signal A. With edge A2 switched to the output 811, then edge 814 becomes part of the output signal 811. Edge 814 is retarded in time compared to the unmodulated position of edge 813 and represents digital data bit="0".

If data bit 802 is a digital "1", then switch 830 selects the next edge C2 of signal C as part of output signal 811. With edge C2 switched to the output 811, then edge 815 becomes part of output signal 811. Edge 815 is advanced in time compared to the unmodulated position of edge 813 and represents digital data bit="1". The subsequent digital data bits after 802 will modulate subsequent edges of the output signal 811, until the end of that frame of modulated signal 811. The next low to high (or alternatively high to low) transition of frame signal 805 will result in switch 830 switching edge B5 of signal B to the output signal 811 as unmodulated edge 816 and the start of the next frame.

Figure 9A:
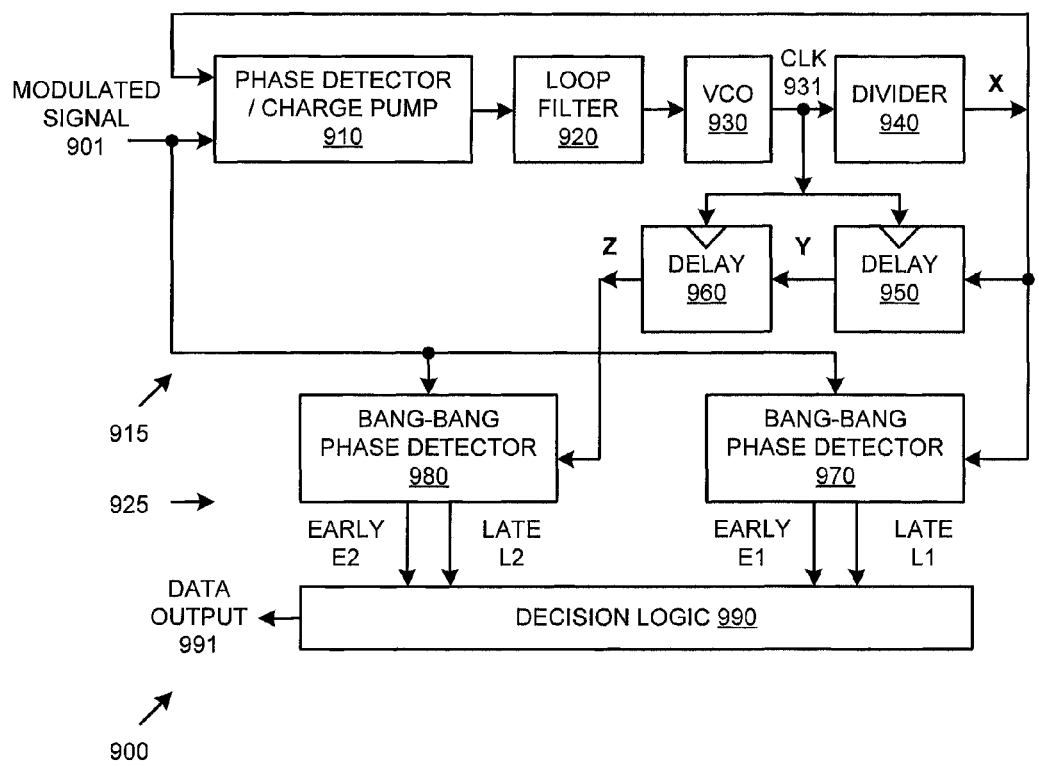
FIGS. 9A and 9B is a block diagram of an exemplary demodulator and associated timing diagrams according to one embodiment of the present invention.
Figure 9B:
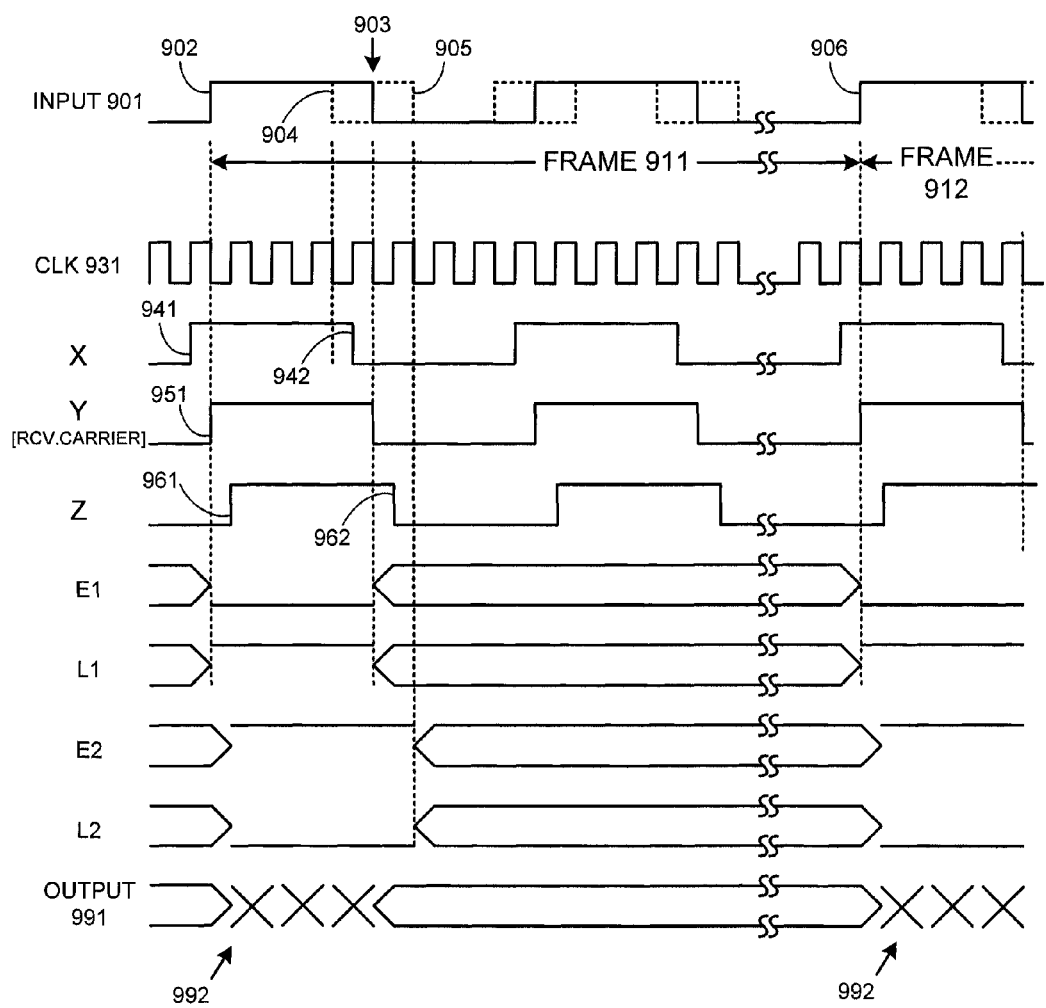

FIG. 9A is a block diagram of an exemplary demodulator 900 and FIG. 9B is a timing diagram for the demodulator of FIG. 9A, according to one embodiment of the present invention. Input 901 is a pulse edge modulated signal connected to the input of phase detector/charge pump 910. The other input of phase detector/charge pump 910 is output X from divider 940. The output of phase detector/charge pump 910 is connected to the input of loop filter 920. The output of loop filter 920 is connected to the input of VCO 930. The output of VCO 930 is clock signal CLK 931. CLK 931 is connected to the input of divider 940 and is used as a clock for delay 950 and delay 960. Phase detector/charge pump 910, loop filter 920, VCO 930 and divider 940 are configured as a phase locked loop (PLL). The output of divider 940 is signal X, which is connected to the input of delay 950. The output of delay 950 is signal Y, which is connected to the input of delay 960. The output of delay 960 is signal Z. The PLL and delays 950 and 960 function as a timing reference generator 915 and generate timing reference signals X, Y and Z, where signal Y is a recovered carrier.

Signals X, Y and Z are square wave digital signals used as timing reference signals. Signal Y is delayed relative to signal X by half of one cycle of clock 931. Signal Z is delayed relative to signal Y by half of one cycle of clock 931. Signal X is connected to the clock input of bang-bang phase detector 970. Signal Z is connected to the clock input of bang-bang phase detector 980. In the exemplary demodulator of FIG. 9A, signals X and Z are used to demodulate modulated signal 901. In other versions of demodulator 900, signal Y can be used to demodulate modulated signal 901. Modulated signal 901 can be demodulated by comparing the relative timing of the edges of signal 901 with the respective edges of recovered carrier signal Y.

Input signal 901 is connected to the data input of phase detectors 970 and 980. A bang-bang phase detector is a type of digital phase detector, which is also known as an Alexander phase detector. Outputs E1 and L1 of phase detector 970 and outputs E2 and L2 of phase detector 980 are connected to decision logic 990. Decision logic 990 processes the outputs of phase detectors 970 and 980 and generates digital data output 991, which is the digital data demodulated from pulse edge modulated signal 901.

Phase detectors 970, 980 and decision logic 990 function as edge discriminator 925. In other embodiments of the present invention, timing reference generator 915 can be separate from demodulator 900, when demodulator 900 is comprised of edge discriminator 925.

Phase detector 970 compares edge 902 of modulated signal 901 to edge 941 of signal X, as summarized by the following if/then statements:

If edge 902 is early with respect to edge 941, then
$E1=1$.

If edge 902 is not early with respect to edge 941, then
$E1=0$.

If edge 902 is late with respect to edge 941, then
$L1=1$.

If edge 902 is not late with respect to edge 941, then
$L1=0$. (1)

Phase detector 980 compares edge 902 of modulated signal 901 to edge 961 of signal Z, as summarized by the following if/then statements:

If edge 902 is early with respect to edge 961, then
$E2=1$.

If edge 902 is not early with respect to edge 961, then
$E2=0$.

If edge 902 is late with respect to edge 961, then
$L2=1$.

If edge 902 is not late with respect to edge 961, then
$L2=0$. (2)

In FIG. 9B, edge 902 is late with respect to edge 941 of signal X, and therefore $E1=0$ and $L1=1$. In FIG. 9B, edge 902 is early with respect to edge 961 of signal Z, and therefore $E2=1$ and $L2=0$. When $E1=0$, $L1=1$, $E2=1$ and $L1=0$, then decision logic 990 determines that edge 902 of input 901 is an unmodulated edge of signal 901 and thus edge 902 is a frame synchronization edge or a start of frame edge for frame 911.

Since edge 902 has been identified as a start of frame edge, then the next N successive edges of signal 901 are modulated edges, where N is an integer greater than one and is equal to the number of data bits modulated in a frame of modulated signal 901.

The relative position of each of the N modulated edges can be evaluated with respect to the original unmodulated position of that edge, prior to modulation as provided by recovered carrier Y. Edge 951 of recovered carrier Y is coincident in time with unmodulated edge 902 of modulated signal 901. Each of the edges of recovered carrier Y have the same timing relationship with the edges of modulated signal 901 in FIG. 9B as carrier B has with the modulated signal 811 in FIG. 8.

In the exemplary demodulator of FIGS. 9A and 9B, the timing of each modulated edge of signal 901 is compared to the respective edges of signals X and Z. Output 901 does not produce valid data output during time intervals 992, after the detection of a start of frame edge, such as 902 or 906 and prior to the demodulation of the first modulated edge in a frame of modulated signal 901.

The next edge, either 904 or 905 of modulated signal 901 is a modulated edge, which can be demodulated. Edge 903 is the original unmodulated position of that edge prior to modulation. Edge 904 is retarded in time relative to edge 903 and represents a digital data state="0". Edge 905 is advanced in time relative to edge 903 and represents a digital data state="1".

Phase detector 970 compares edge 904 of modulated signal 901 to edge 942 of signal X, as summarized by the following if/then statements:

If edge 904 is early with respect to edge 942 of, then
    E1=1.

If edge 904 is not early with respect to edge 942, then
    E1=0.

If edge 904 is late with respect to edge 942, then
    L1=1.

If edge 904 is not late with respect to edge 942, then
    L1=0.                                                  (3)

Phase detector 980 compares edge 904 to edge 962 of signal Z as summarized by the following if/then statements:

If edge 904 is early with respect to edge 962 of, then
    E2=1.

If edge 904 is not early with respect to edge 962, then
    E2=0.

If edge 904 is late with respect to edge 962, then
    L2=1.

If edge 904 is not late with respect to edge 962, then
    L2=0.                                                  (4)

If decision logic 990 determines that E1=1, L1=0, E2=1 and L2=0, then demodulator 900 has determined that edge 904 exists and that therefore output 991 for bit 992 has a digital bit state=0. A similar timing analysis of edge 905 by phase detectors 970 and 980 using the previously listed if/then statements sets 3 and 4 can be used to determine the values of E1, L1, E2 and L2.

If decision logic 990 determines that E1=0, L1=1, E2=0 and L2=1, then demodulator 900 has determined that edge 905 exists and that therefore output 991 will be set to have a digital bit state=1. The next N−1 modulated edges of signal 901 can be demodulated and generate respective N−1 digital bits of output in a similar manner by demodulator 900. After frame 911 of modulated signal 901 has been demodulated, then the next unmodulated edge 906 can be detected as a start of frame edge for frame 912 and demodulator 900 can continue to demodulate signal 901.

Figure 10:
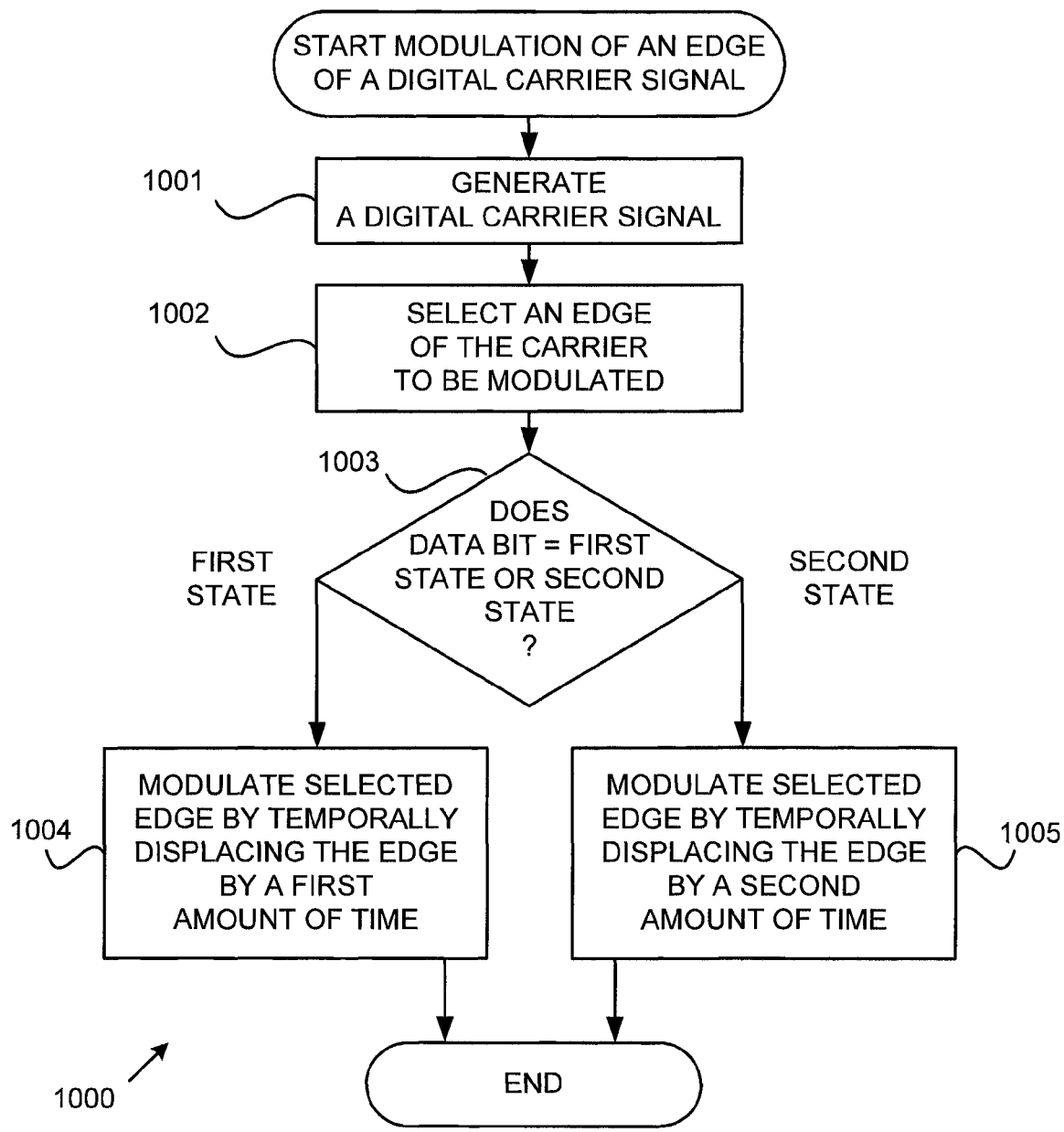
FIG. 10 is a flow diagram illustrating an exemplary process for modulating an edge of a digital carrier signal, according to an embodiment of the present invention.

FIG. 10 is a flow diagram illustrating an exemplary process 1000 for modulating an edge of a digital carrier signal according to the present invention, as shown, for example, with respect to the signals of FIG. 2A. In block 1001, carrier 210 is generated and flow proceeds to block 1002 and an edge, e.g., 212 of carrier 210 is selected to be modulated. From 1002, flow proceeds to block 1003, and the data bit to be modulated onto carrier 210 is evaluated. If the data bit has a first state, then flow proceeds to block 1004 and the selected edge is temporally shifted by a first amount. If the data bit has a second state, then flow proceeds to block 1005 and the selected edge is temporally shifted by a second amount.

An example of how process 1000 operates can be seen in FIG. 2. Digital data bit 222 is input to process 1000. In block 1001, carrier 210 is generated. In block 1002, an edge, such as 212 of carrier 210 is selected for modulation by a data bit. In block 1003, data bit 222 equal to a digital "1" is evaluated, where in the example of FIG. 2A, the first state=digital "0" and the second state=digital "1" Since data bit 222="1", then flow proceeds to block 1005, where a temporal displacement of a second amount of time is performed. In the example of FIG. 2A, the second amount of time means advancing edge 212 in time according to time interval 242, to position 232.

An alternate path through process 1000 occurs when edge 213 is selected in block 1002 and flow proceeds to block 1003, where an edge, such as 213 of carrier 210 is selected for modulation by a data bit. In block 1003, data bit 223 equal to digital "0" is evaluated, where in the example of FIG. 2A, the first state=digital "0" and the second state=digital "1". Since data bit 223="0", then flow proceeds to block 1004, where a temporal displacement of a first amount of time is performed. In the example of FIG. 2A, a temporal displacement of a first amount of time means retarding edge 213 in time, according to time interval 243, to position 233.

Figure 11:
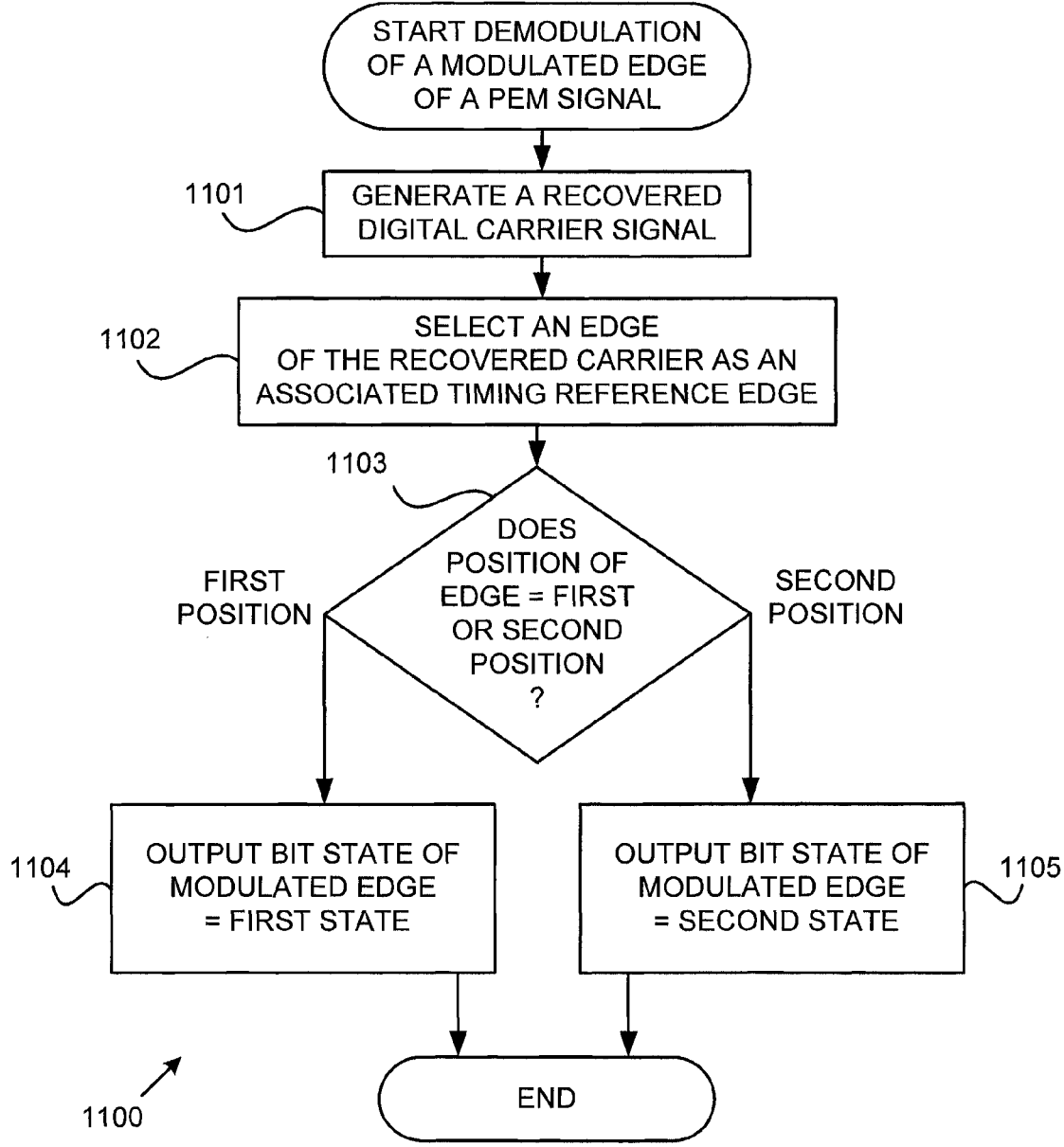
FIG. 11 is a flow diagram illustrating an exemplary process for demodulating a modulated edge of a digital carrier signal, according to an embodiment of the present invention.

FIG. 11 is a flow diagram illustrating an exemplary process 1100 for demodulating a modulated edge of a pulse edge modulated signal according to the present invention, as shown, for example, with respect to the signals of FIG. 2B. In block 1101, a recovered carrier is generated. From block 1101, flow proceeds to block 1102, and an edge of the recovered carrier is selected as a timing reference edge for the modulated edge that is to be demodulated. For example, if edge 232 in FIG. 2B is to be demodulated, then selecting a timing reference edge, such as edge 252, associates edge 252 with the respective modulated edge 232. The timing reference edge 252 represents the original position of modulated edge 232, prior to modulation. Generating a recovered carrier with timing reference edges has previously been discussed with regard to the operation of demodulator 900 in FIG. 9.

In block 1103, the position of the modulated edge with respect to its associated timing reference edge is determined. If the modulated edge is displaced to a first position with respect to the timing reference point, then flow proceeds to block 1104. In block 1104, an output equal to a first data bit state is generated corresponding to the determined position of the modulated edge. If the modulated edge is displaced to a second position with respect to the timing reference point, then flow proceeds to block 1105. In block 1105, an output equal to a second data bit state is generated corresponding to the determined position of the modulated edge.

An example of how process 1100 operates can be seen in FIG. 2B, with respect to modulated edges 232 and 233. Modulated edge 232 of signal 230 is an edge to be demodulated by process 1100. In block 1101, a recovered carrier 250 is generated, including timing reference edges 251-253. In block 1102, timing reference edge 252 is selected and associated with modulated edge 232. In block 1103, the position of modulated edge 232 with respect to its associated timing reference edge 252 is determined. In FIG. 2B, modulated edge 232 is advanced in time, according to time interval 262, which corresponds to a temporal displacement to a second position. Then flow proceeds to block 1105, where a data bit output equal to a second data bit state, (which in FIG. 2B equals a data bit output 272 of "1") is generated corresponding to the determined position of modulated edge 232.

An alternate path through process 1100 occurs when modulated edge 233 is demodulated. In block 1101, recovered carrier 250 is generated, including timing reference edges 251-253. In block 1102, timing reference edge 253 is selected and associated with modulated edge 233. In block 1103, the position of modulated edge 233 with respect to its associated timing reference edge 253 is determined. In FIG. 2B, modulated edge 233 is retarded in time, according to time interval 263, which corresponds to a temporal displacement to a first position in process 1100. Then flow proceeds to block 1104, where a data bit output equal to a first data bit state, (which in FIG. 2B equals a data bit output 273 of "0") is generated corresponding to the determined position of modulated edge 233.

Figure 12:
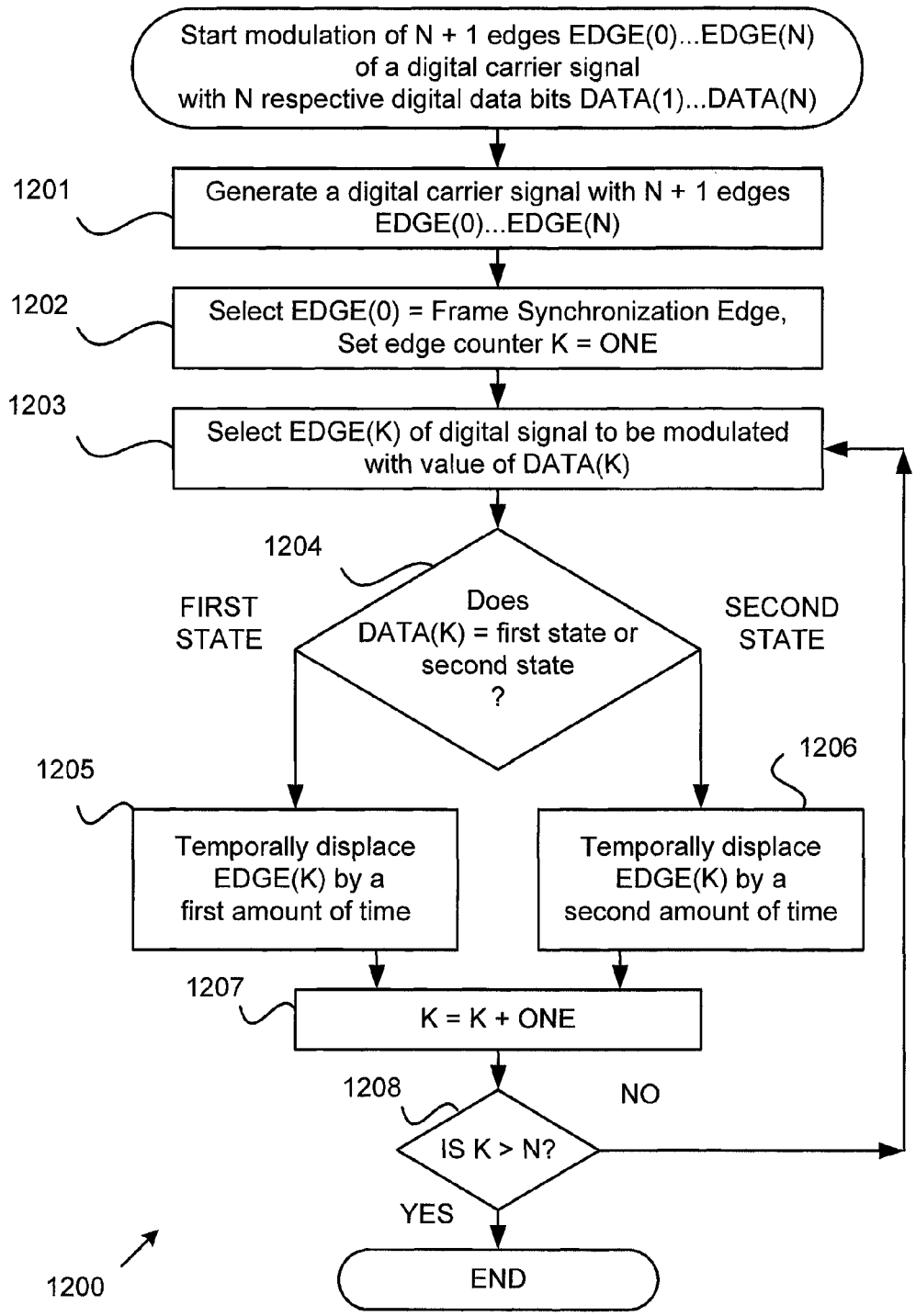
FIG. 12 is a flow diagram illustrating an exemplary process for modulating N edges of a digital carrier signal, according to another embodiment of the present invention.

FIG. 12 is a flow diagram illustrating an exemplary process 1200 for modulating N+1 edges EDGE(0) . . . EDGE(N) of a carrier, such as, for example, signal 310 in FIG. 3A, with N respective digital data bits, DATA(1) . . . DATA(N). In block 1201, a carrier with EDGE(0) . . . EDGE(N) is generated and flow proceeds to block 1202. In block 1202, EDGE(0) of the modulated signal is selected as a frame synchronization edge and edge counter K is set equal to 1. Selection of EDGE(0) as a frame synchronization edge means that EDGE(0) will not be modulated. Edge counter K is used by process 1200 to keep track of which EDGE(i) is being modulated. From 1202, flow proceeds to block 1203, and the first of the N edges, EDGE (1), of the carrier is selected to be modulated. From block 1203, flow proceeds to block 1204, and the value of the first digital data bit DATA(1) is evaluated. If DATA(1)=first state (for example, =0), then flow proceeds to block 1205. If DATA (1)=second state (for example, =1), then flow proceeds to block 1206. In block 1205, EDGE(1) is temporally displaced by a first time interval, for example, by retarding EDGE(1) in time. In block 1206, EDGE(1) is temporally displaced by a second time interval, for example, by advancing EDGE(1) in time.

After blocks 1205 and 1206, flow proceeds to block 1207 and the edge counter K is incremented by 1. From block 1207, flow proceeds to block 1208, and the value of K is compared with the value of N. If the value of K is greater than N, then all N edges of the carrier have been modulated. If the value of K is less than or equal to N, then flow proceeds back to block 1203 and the next EDGE(K) of the carrier is modulated with the digital data value of DATA(K). Process 1200 continues in this loop until the process ends.

Figure 13:
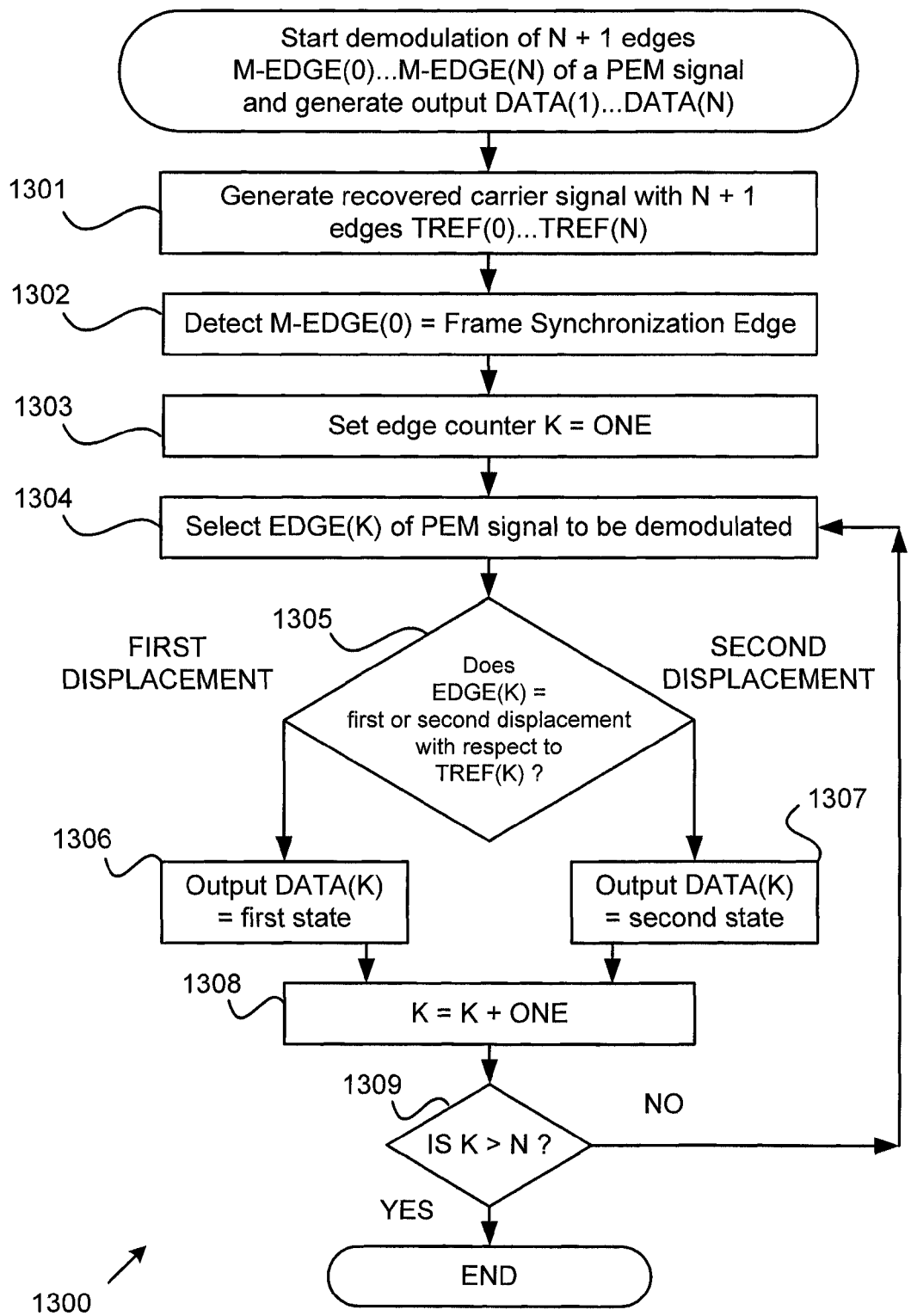
FIG. 13 is a flow diagram illustrating an exemplary process for demodulating N modulated edges of a digital carrier signal, according to another embodiment of the present invention.

FIG. 13 is a flow diagram illustrating an exemplary process 1300 for demodulating N+1 modulated edges M-EDGE(O) . . . M-EDGE(N) of a pulse edge modulated (PEM) signal, such as, for example, modulated signal 330 in FIG. 3B, and generating an output of N digital data bits DATA(1). DATA(N) according to another embodiment of the present invention. In block 1301, a recovered carrier is generated and N+1 timing reference edges TREF(0) . . . TREF(N) are generated. The N+1 timing reference edges correspond to N+1 points in time, such as, for example, edges 351, 352, 353, etc. of recovered carrier 350 in FIG. 3B. The N timing references edges TREF(1)-TREF(N) of the recovered carrier are points in time representing the positions of the respective modulated edges M-EDGE(1) . . . M-EDGE(N), prior to modulation.

From block 1301, flow proceeds to block 1302 and frame synchronization edge EDGE(0) is detected. Frame synchronization edge EDGE(0) is an unmodulated edge of the modulated signal. From block 1302, flow proceeds to block 1303 and edge counter K is set equal to 1. The edge counter K is used by process 1300 to keep track of which edge M-EDGE(i) is being demodulated. From 1303, flow proceeds to block 1305, and the first of the N edges, M-EDGE(1), of the modulated signal is selected to be demodulated. From block 1304, flow proceeds to block 1305, and the temporal displacement of the first modulated edge M-EDGE(1) is evaluated. The timing of M-EDGE(1) is compared to the timing of its respective TREF(1). If the difference in time between M-EDGE(1) and TREF(1) is equal to a first displacement in time, then flow proceeds to block 1306. A first displacement in time can be equal to a retarding in time of a modulated edge, such as, the example shown in FIG. 3B, where modulated edge 333 is retarded prior to recovered carrier edge 353. If the difference in time between M-EDGE(1) and TREF(1) is equal to a second displacement in time, then flow proceeds to block 1307. A second displacement in time can be equal to an advancing in time of a modulated edge, such as, the example shown in FIG. 3B, where modulated edge 332 is advanced in time with respect to recovered carrier edge 352.

In block 1306, the value of DATA(1) is set to the value that corresponds to a first displacement of the modulated edge EDGE(1). In the example of FIG. 3B, a first displacement, i.e., a retarding in time of a modulated edge, corresponds to a digital data bit="0". In block 1307, the value of DATA(1) is set to the value that corresponds to a second displacement of the modulated edge EDGE(1). In the example of FIG. 3B, a second displacement, i.e., an advancing in time of a modulated edge, corresponds to a digital data bit="1".

After blocks 1306 and 1307, flow proceeds to block 1308 and the edge counter K is incremented by 1. From block 1308, flow proceeds to block 1309, and the value of K is compared with the value of N. If the value of K is greater than N, then all N edges of the modulated signal have been demodulated. If the value of K is less than or equal to N, then flow proceeds back to block 1304 and the next M-EDGE(K) of the modulated signal is demodulated and an output is generated with a digital data value of DATA(K). Process 1300 continues in this loop until the process ends when all N edges of the modulated signal have been demodulated.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

We claim:

1. A system for modulating a digital carrier signal with N data bits to generate a frame of a pulse edge modulated (PEM) signal having N+1 pulse edges, wherein the frame comprises a frame synchronization edge and N modulated edges, each one of the N modulated edges being modulated with a respective one of the N data bits, each one of the N data bits having a value corresponding either to a first state or to a second state, and N is an integer greater than one, the system comprising:
   a signal generator configured to provide a digital carrier signal, wherein the carrier comprises a pulse train having at least N+1 pulse edges; and a modulator configured to modulate each one of N edges of the carrier with a respective one of the N data bits, wherein the modulator is configured to select an edge of the carrier as the frame synchronization edge, wherein modulating an edge of the carrier by a data bit at the first state temporally displaces such edge by a first amount of time, wherein modulating an edge of the carrier by a data bit at the second state temporally displaces such edge by a second amount of time, and wherein the PEM signal comprises a multiphase signal of three phases, where each of the three phases is equally spaced in phase angle.

2. The system of claim 1, wherein the first state of a data bit consists of either a digital bit state of "0" or a digital bit state of "1".

3. The system of claim 1, wherein the second state of a data bit consists of either a digital bit state of "0" or a digital bit state of "1".

4. The system of claim 1, wherein an edge of the PEM signal consists of either a rising edge or a falling edge.

5. The system of claim 1, wherein temporally displacing an edge by the first amount of time consists of either retarding or advancing in time the edge.

6. The system of claim 1, wherein temporally displacing an edge by the second amount of time consists of either retarding or advancing in time the edge.

7. The system of claim 1, wherein the frame synchronizing edge consists of either a start of frame marker or an end of frame marker.

8. The system of claim 1, and further comprising a transmission line and a remote unit, wherein the multiphase signal is transmitted to the remote unit over the transmission line, the remote unit comprising:

a multiphase signal to DC voltage converter coupled to the multiphase signal, wherein the converter generates a DC voltage from the multiphase signal; and a power supply coupled to the DC voltage generated by the converter, wherein the generated DC voltage is utilized to power the system.

9. The system of claim 1, and further comprising a first transmission line and a remote unit, wherein the system transmits the PEM signal to the remote unit over the first transmission line, the remote unit comprising:

a signal recovery circuit configured to recover a digital carrier signal from the PEM signal, wherein the recovered carrier comprises a pulse train having at least N+1 pulse edges, wherein one edge of the recovered carrier is coincident with the frame synchronization edge of the PEM signal, and a demodulator configured to demodulate each one of the N modulated edges of the PEM signal and to provide an output corresponding to the state of each of the respective N data bits, wherein demodulating each one of the N modulated edges determines whether a modulated edge has a first position or a second position in time relative to the position in time of the modulated edge prior to modulation, and wherein the first position in time of the modulated edge corresponds to a first state of a data bit and the second position in time of the modulated edge corresponds to a second state of a data bit.

10. The system of claim 9, wherein the position in time of a modulated edge prior to modulation comprises the position in time of a respective edge of the recovered carrier.

11. The system of claim 9, wherein the first state of a data bit consists of either a digital bit state of "0" or a digital bit state of "1".

12. The system of claim 9, wherein the second state of a data bit consists of either a digital bit state of "0" or a digital bit state of "1".

13. The system of claim 9, wherein a modulated edge with a first position in time consists of an edge either retarded in time or advanced in time.

14. The system of claim 9, wherein a modulated edge with a second position in time consists of an edge either retarded in time or advanced in time.

15. The system of claim 9, wherein the demodulator further comprises an edge discriminator for detecting the frame synchronization edge.

16. The system of claim 9, wherein the frame synchronizing edge consists of either a start of frame marker or an end of frame marker.

17. The system of claim 9, and further comprising a second set of transmission lines for receiving communications signals from the remote unit, when the PEM signals transmitted to the remote system on the first set of transmission lines are substantially unchanged.

18. The system of claim 17, and further comprising a transmitter in the remote unit for transmitting communications signals on the second set of transmission lines, wherein the demodulator in the remote unit generates a transmit enable signal sent to the transmitter to enable the transmission of communications signals on the second set of transmission lines from the remote unit during a time period, when the PEM signals transmitted to the remote system on the first set of transmission lines are substantially unchanged.

19. The system of claim 1, wherein the system comprises a device configured for implantation in living tissue.

20. A modulator, configured for modulating a digital carrier signal with N data bits to generate a frame of a pulse edge modulated (PEM) signal having N+1 pulse edges, the modulator arranged to receive a frame timing signal and a digital data input having N data bits, wherein a frame of the PEM signal comprises a frame synchronization edge and N modulated edges, each one of the N modulated edges being modulated with a respective one of the N data bits, wherein each one of the N data bits has a value corresponding either to a first state or a second state and N is an integer greater than one, the modulator comprising:

a signal generator configured to provide a first reference signal, wherein the first reference signal is a pulse train having at least N+1 edges;

means for generating a second reference signal delayed by a first amount of time relative to the first reference signal, wherein the second reference signal comprises the digital carrier signal;

means for generating a third reference signal delayed by a second amount of time relative to the second reference signal; and a signal selector switch configured to:

a.) receive the frame timing signal, the digital data input of N data bits, and the first, second and third reference signals, and b.) to generate thereby, the PEM signal.

21. The modulator of claim 20, wherein the signal selector switch is further configured:

a.) responsive to the received frame timing signal, to select an edge of the carrier as the frame synchronization edge of the PEM signal, b.) responsive to a received data bit with a first state, to select an edge of the first reference signal as an edge of the PEM signal, and c.) responsive to a received data bit with a second state, to select an edge of the third reference signal as an edge of the PEM signal.

22. The modulator of claim 21, wherein the first state of a data bit consists of either a digital bit state of "0" or a digital bit state of "1".

23. The modulator of claim 21, wherein the second state of a data bit consists of either a digital bit state of "0" or a digital bit state of "1".

24. The modulator of claim 21, wherein the frame synchronizing edge consists of either a start of frame marker or an end of frame marker.

25. The modulator of claim 20, wherein the modulator is configured for implantation in living tissue.

\* \* \* \* \*